United States Patent
Gumbrecht et al.

(10) Patent No.: US 9,519,039 B2
(45) Date of Patent: Dec. 13, 2016

(54) DETERMINING THE FORM OF RF PULSES FOR SELECTIVE EXCITATION IN MAGNETIC RESONANCE IMAGING

(75) Inventors: Rene Gumbrecht, Herzogenaurach (DE); Kaveh Vahedipour, Cologne (DE); Tony Stoecker, Duesseldorf (DE); Nadim Joni Shah, Juelich (DE)

(73) Assignee: Siemens Healthcare GmbH (DE)

( * ) Notice: Subject to any disclaimer, the term of this patent is extended or adjusted under 35 U.S.C. 154(b) by 764 days.

(21) Appl. No.: 14/000,493

(22) PCT Filed: Feb. 15, 2012

(86) PCT No.: PCT/EP2012/052539
§ 371 (c)(1),
(2), (4) Date: Dec. 10, 2013

(87) PCT Pub. No.: WO2012/110530
PCT Pub. Date: Aug. 23, 2012

(65) Prior Publication Data
US 2015/0042330 A1    Feb. 12, 2015

(30) Foreign Application Priority Data
Feb. 20, 2011   (DE) .................. 10 2011 004 432

(51) Int. Cl.
*G01R 33/483*      (2006.01)
*G01R 33/385*      (2006.01)
(Continued)

(52) U.S. Cl.
CPC ......... *G01R 33/4833* (2013.01); *G01R 33/385* (2013.01); *G01R 33/4818* (2013.01); *G01R 33/56* (2013.01)

(58) Field of Classification Search
CPC .............. G01R 33/4833; G01R 33/385; G01R 33/4818; G01R 33/56
See application file for complete search history.

(56) References Cited

U.S. PATENT DOCUMENTS

| | | | | |
|---|---|---|---|---|
| 2002/0014889 A1* | 2/2002 | Prussmann | ........ | G01R 33/5611 324/307 |
| 2005/0110488 A1* | 5/2005 | Zhu | ...................... | G01R 33/288 324/309 |

(Continued)

FOREIGN PATENT DOCUMENTS

| | | |
|---|---|---|
| DE | 10 2004 057030 a1 | 6/2005 |
| DE | 10 2006 058163 B3 | 6/2008 |

(Continued)

OTHER PUBLICATIONS

NPL reference Stocker et al. "Simullation of spin dynamics: a tool in MRI system development" Journal of Physics: Conference Series, Institute of Physics Publishing. Bristol, GB, vol. 295, No. 1, Publication date May 27, 2011.*

(Continued)

*Primary Examiner* — Rodney Bonnette
(74) *Attorney, Agent, or Firm* — Tarolli, Sundheim, Covell & Tummino LLP

(57) ABSTRACT

The invention relates to a magnetic resonance method involving the generation of high-frequency pulses and magnetic gradients ($g_x$, $g_y$, $g_z$) for the selective excitation of an object to be examined. According to the invention, the magnetic resonance method is characterized in that a magnetic resonance signal s(t) according to the following signal equation is generated:

Figure 1:
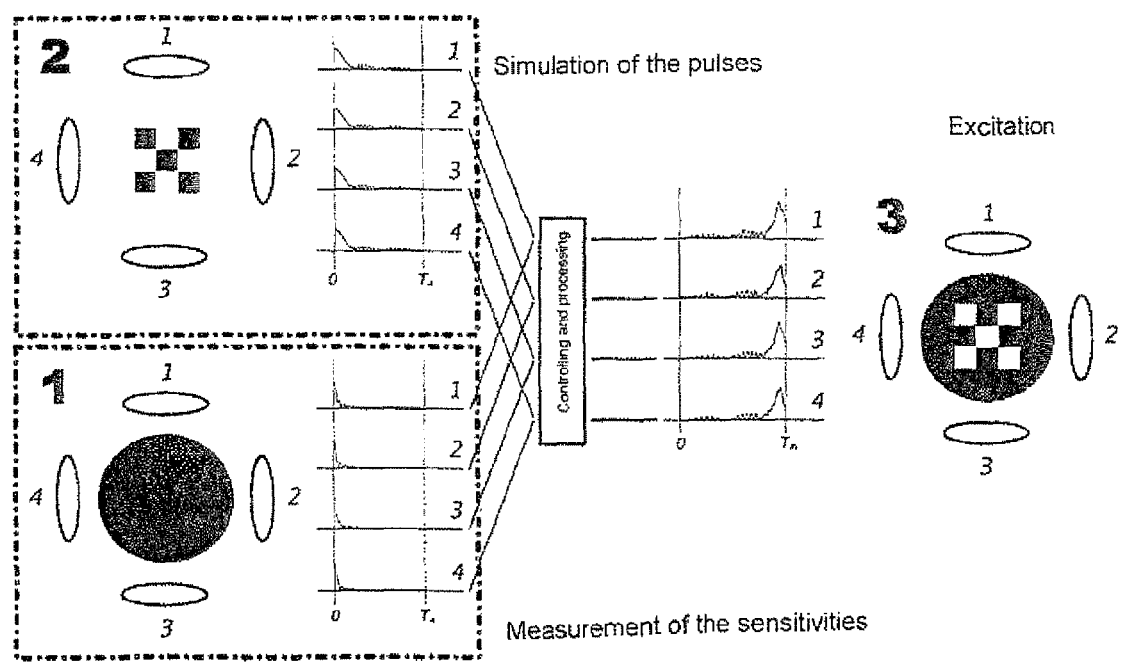

$$s(t) = \int_V m(\vec{r}, T) \exp[t/T_2] \exp[it\omega_s] \exp\left[-i\vec{k}(T-t)\cdot\vec{r}\right] d^3r$$

wherein $m(\vec{r}, T)$ stands for a desired transversal magnetization after the selective excitation, t stands for a time, $\vec{r}$ stands for a position vector and T stands for a duration of a pulse, and whereby s(t) stands for a magnetic resonance signal, V stands for a volume that is to be examined, $T_2$ stands for a transversal relaxation time, and $\omega_s$ stands for a shift of the resonance frequency. The invention also relates to a nuclear spin tomograph for carrying out the magnetic resonance method.

8 Claims, 5 Drawing Sheets

Schematic depiction of the pulse generation procedure

(51) Int. Cl.
      *G01R 33/48*    (2006.01)
      *G01R 33/56*    (2006.01)

(56) References Cited

U.S. PATENT DOCUMENTS

2010/0066362 A1* 3/2010 Ullmann ............ G01R 33/4836
                                                            324/309
2012/0262170 A1* 10/2012 Gumbrecht ........ G01R 33/5612
                                                            324/309

FOREIGN PATENT DOCUMENTS

DE    10 2008 029 175 B4    12/2009
DE    10 2009 002 112 B3     8/2010

OTHER PUBLICATIONS

International Search Report for corresponding PCT/EP2012/052539 completed May 2, 2012.
Ben-Eliezer, et al.: "*High-Definition, Single-Scan 2D MRI in Inhomogeneous Fields Using Spatial Encoding Methods*"; ScienceDirect, Magnetic Resonance Imaging 28 (2010) 77-86, www.sciencedirect.com.
Grissom, et al.: "*Additive Angle Method for Fast Large-Tip-Angle RF Pulse Design in Parallel Excitaton*"; Magnetic Resonance in Medicine 59:779-787 (2008).
Jellúš, et al.: "*An NMR Technique for Measurement of Magnetic Field Gradient Waveforms*"; Science Direct, Journal of Magnetic Resonance 162 (2003)189-197, www.sciencedirect.com.
Pearman, et al.: "*Relaxivity Corrected Response Modulated Excitation (RME): A $T_2$-Corrected Techinque Achieving Specified Magnetization Patterns from an RF Pulse and a Time-Varying Magnetic Field*", MRM 32:388-395 (1994).
Stöcker, et al.: "*Simulation of Spin Dynamics: A Tool in MRI System Development*"; $19^{th}$ International Spin Physics Symposium (SPIN2010), Journal of Physics: Conference Series 295 (2011) 012020, 1-8.
Tal, et al.: "*Spatial Encoding and the Single-Scan Acquisition of High Definition MR Images in Inhomogeneous Fields*", Science Direct, Journal of Magnetic Resonance 182 (2006) 179-194, www.sciencedirect.com.
Yip, et al.: "*Iterative RF Pulse Design for Multidimensional, Small-Tip-Angle Selective Excitation*", Magnetic Resonance in Medicine 54:908-917 (2005).

* cited by examiner

DETERMINING THE FORM OF RF PULSES FOR SELECTIVE EXCITATION IN MAGNETIC RESONANCE IMAGING

FIELD OF THE INVENTION

The invention relates to a magnetic resonance method involving the generation of high-frequency pulses and magnetic gradients ($G_x$, $G_y$, $G_z$) for spatially selective excitation.

It is known that magnetic resonance excitations can be generated by combinations of high-frequency signals with magnetic gradients (especially gradient pulses).

Such magnetic resonance methods can be used for imaging and/or for spectroscopy.

The invention also relates to a nuclear spin tomograph having a means for generating magnetic gradients, a means for generating high-frequency pulses, a means for data acquisition, and a means for generating a static main magnetic field.

STATE OF THE ART

The fundamental principles of spatially resolved nuclear magnetic resonance—which is taken below as the basis for the understanding of the invention—are described, for example, in the monograph by P. Mansfield and P. G. Morris titled "MMR Imaging in Biomedicine" (Academic Press, 1982) as well as in the monograph by P. T. Callaghan titled "Principles of Nuclear Magnetic Resonance Microscopy" (Clarendon Press, Oxford 1991, ISBN 0198539444). Moreover, the textbook "Magnetic Resonance Imaging" by E. Mark Haacke et al. (Wiley-Liss, 1999) provides detailed descriptions of nuclear magnetic resonance as well as of nuclear magnetic imaging. Furthermore, the above-mentioned publication by Haacke et al. contains technical and functional information about the structure and operation of a nuclear spin tomograph. The present application makes full use by reference of the content of the above-mentioned publications as well as of the publications pertaining to the state of the art that are listed below.

Pauly et al. in "A k-Space Analysis of Small-Tip-Angle Excitation", J Magn Reson (1998) vol. 81 (1) pp. 43-56, and Pauly et al. in "A Linear Class of Large-Tip-Angle Selective Excitation Pulses", J Magn Reson (1989) vol. 82 (3) pp. 571-587 describe the k-space analysis and the design approach of spatially selective magnetic resonance excitations having high-frequency pulses and gradient pulses.

Katscher et al. in "Theoretical and numerical aspects of transmit SENSE", IEEE T Med Img (2004) and Zhu, in "Parallel excitation with an array of transmit coils", Magn Reson Med (2004) vol. 51 (4) pp. 775-84, describe the use of multiple channel methods in magnetic resonance.

Moreover, various methods are known for calculating the high-frequency pulses (Ullmann et al. 2005, Grissom et al. 2006, Zelinski et al. 2007, Yip et al. 2007, Grissom et al. 2008, Xu et al. 2008).

Furthermore, fundamental methods are presented in Hoge et al, in "Density Compensation Functions for Spiral MRI", Magn Reson Med (1997) vol. 38 (1) pp. 117-128.

German patent application DE 10 2004 057 030 A1 discloses a system having several transmission coils with corresponding HF pulse synthesizers and amplifiers. Moreover, a method is described for configuring HF pulses that are specific or individual for each transmission coil, in order to generate spatial, time variants in a combined magnetic field.

The magnetic resonance methods according to the state of the art are very time-consuming and require extensive computational work. Another drawback of the state of the art is that interference effects such as, for example, field inhomogeneity, have a major influence on the selective excitation and, instead of bringing about the desired selection, can result in a different selection.

OBJECTIVE OF THE INVENTION

The present invention has the objective of avoiding the above-mentioned drawbacks. In particular, a magnetic resonance method is to be put forward that requires the smallest possible time investment and the least possible computational work to generate selective excitations which are not sensitive to external interference effects.

BRIEF DESCRIPTION OF THE INVENTION

The invention provides for carrying out a magnetic resonance method involving the generation of high-frequency pulses and magnetic gradients ($G_x$, $G_y$, $G_z$) for the selective excitation of an object that is to be examined, whereby this is done in such a way that a magnetic resonance signal s(t) according to the following signal equation is generated:

$$s(t) = \int_V m(\vec{r}, T)\exp[t/T_2]\exp[it\omega_s]\exp\left[-i\vec{k}(T-t)\cdot\vec{r}\right]d^3r$$

wherein $M(\vec{r},T)$ stands for a desired transversal magnetization after the selective excitation, t stands for a time, $\vec{r}$ stands for a position vector and T stands for a duration of a pulse, and whereby s(t) stands for a magnetic resonance signal, V stands for a volume that is to be examined, $T_2$ stands for a transversal relaxation time, and $\omega_s$ stands for a shift of the resonance frequency.

The presented new method is used to determine selective high-frequency pulses for applications in magnetic resonance tomography. In this process, the method employs fundamental physical and mathematical principles, especially the reciprocity principle, as well as time invariance, in order to convert an inversion problem into an equivalent but much simpler description that is based on the acquisition of a hypothetical magnetic resonance signal. Except for normalizing factors, this signal is the same as the sought high-frequency pulse. Consequently, the following advantages arise as compared to the prior-art methods:

Direct (non-iterative) finding of an unambiguous solution.

The solution is obtained by the superposition of analytical solutions and is consequently inherently parallelizable and thus very quickly available.

The process directly takes into account interference effects such as field inhomogeneities and relaxation, so that the solutions behave robustly with respect to these interference effects.

The method can be used directly without a great deal of numerical effort for the case of multiple excitation channels, that is to say, selective excitation using the spatial sensitivities of several high-frequency excitation coils, which, for the sake of simplicity, will be referred to below as coils.

The invention is characterized in that the high-frequency pulse $b_1(t)$ is generated on the basis of the following formula:

$$b_1(t) = \frac{J(t)}{i\gamma m_0} s(T-t)$$

that is to say, except for factors, the high-frequency pulse corresponds to the time-inverted magnetic resonance signal. Here, $J(t)$ is the Jacobi determinant for describing the k-space volume element along a trajectory. Under the premise of the bijectivity of $k(t)$ onto a value range of t, the Jacobi determinant $J(t)$ yields a dependence of the coordinate transformation between the time parameterization and the k-space parameterization. In the case of an analytically given k-space trajectory, $J(t)$ can be calculated explicitly. Thus, for example, in the case of an Archimedean spiral, $$J(t) = \frac{\gamma}{2\pi} |\vec{k}(t) \cdot \vec{g}(t)|,$$

wherein $$\vec{g}(t) = \frac{2\pi}{\gamma} \frac{\partial \vec{k}(t)}{\partial t}$$

describes a pulse shape of the gradient.

The refinement of the method is based on the approximation for small excitation angles (Small-Tip-Angle Approximation, STA) described by Pauly (1988, 1989). According to this, the selectively excited magnetization is described by:

$$m(\vec{r}, T) = i\gamma m_0 \exp[-T/T_2] \exp[-iT\omega_s] \int_0^T \exp[t/T_2] \exp[it\omega_s] b_1(t) \exp[i\vec{k}(t) \cdot \vec{r}] dt \quad (1)$$

wherein $m(\vec{r},T)$ stands for desired transversal magnetization after the selective excitation, $t, \vec{r}, T$ stands for time, position vector, duration of the pulse, $i, \gamma, m_0$ stands for imaginary unit, gyromagnetic ratio, equilibrium magnetization, $T_2, \omega_s$, stands for transversal relaxation time, shift of the resonance frequency, $b_1(t), \vec{K}(t)$ stands for high-frequency pulse, vector of the k-space trajectory (given by gradients).

Equation (1) formulates an inverse problem since it has to be resolved on the basis of the sought high-frequency pulse, $b_1(t)$, with a given k-space trajectory of the gradients, $k(t)$, as well as with the given pattern for the excitation, $M(r,T)$, which describes the target region.

In contrast to the original presentation by Pauly (1988), Equation (1) differs by the additional consideration of interference effects during the pulse, that is to say, taking into consideration the transversal relaxation $T_2$ and the shift of the Larmor frequency $(\omega_s)$. The latter can occur, for instance, due to the presence of inhomogeneities in the main field. In contrast to the original presentation by Pauly (1988), Equation (1) differs by the additional consideration of interference effects during the pulse, that is to say, taking into consideration the transversal relaxation $(T_2)$ and the shift of the Larmor frequency $(\omega s)$. The shift of the Larmor frequency $(\omega_s)$ can occur, for instance, due to the presence of inhomogeneities in the main field.

The method according to the invention utilizes the reciprocity for the signal equation of the magnetic resonance imaging $$s(t) = \int_V M(\vec{r}, T) \exp[t/T_2] \exp[it\omega_s] \exp[-i\vec{k}(T-t) \cdot \vec{r}] d^3r \quad (2)$$

which, in the present form, however, describes a time reversal $t:T \to 0$, that is to say, a hypothetical magnetic resonance signal $s(t)$, resulting from a volume that is to be examined V, is calculated backwards in time along the k-space trajectory $k(T-t)$ which is traversed backwards. In this process, the initial magnetization is determined by Equation (1) and thus by the target region of the selective excitation. The magnetic resonance signal can be determined either by a numerical simulation of Equation (2) or, in certain cases, also directly by means of a measurement. The sought high-frequency pulse is then found to be:

$$b_1(t) = \frac{J(t)}{i\gamma m_0} s(T-t) \quad (3)$$

that is to say, except for factors, the high-frequency pulse corresponds to the time-inverted magnetic resonance signal. Here, $J(t)$ is the Jacobi determinant of the k-space volume element along the trajectory (Hoge et al, 1997).

An especially preferred embodiment of the invention is characterized in that N coils having a different spatial transmission characteristic are used for the excitation.

After all, if N coils having a different spatial transmission characteristic are used for the excitation, that is to say, if multiple excitation channels are used (Katscher et al. 2003; Zhu, 2004), then the entire high-frequency pulse is obtained as a spatially different, weighted superposition of the pulses of the individual channels $$b_1(t, \vec{r}) = \sum_{n=1}^{N} \sigma_n(\vec{r}) b_n(t) \quad (4)$$

wherein $\sigma_n(r)$ stands for a known position-dependent sensitivity of the $n^{th}$ channel and $b_n(t)$ stands for a sought high-frequency pulse of the $n^{th}$ channel.

The use of Equation (4) in Equation (1) yields the formulation of the problem for the selective excitation in case of multiple channels. Corresponding to Equations (2) and (3), a solution of the problem can also be found here by means of a hypothetical magnetic resonance signal, whereby now n signals with corresponding receiving sensitivities, $\sigma_n^*(r)$, have to be determined ('*' refers to the complex conjugation):

$$s_n(t) = \int_V \sigma_n^*(\vec{r}) m(\vec{r}) \exp[-t/T_2] \exp[-it\omega_s] \exp[-i\vec{k}(T-t) \cdot \vec{r}] d^3r \quad (5)$$

If now, equivalent to the case of a single channel, these N signals are determined for the above-mentioned magnetization along the time-inverted trajectory, k(T−t)—either by a numerical simulation of Equation (5) or by a measurement—then the sought high-frequency pulses, analogously to Equation (3), are found to be $$b_n(t) = \frac{J(t)}{i\gamma m_0} s_n(T-t) \quad (6)$$

Thus, all in all, the determination of the high-frequency pulses, that is to say, the solution of Equation (1) in the case of single channels or multiple channels, is reduced to the determination of magnetic resonance signals, which can generally by carried out by numerically efficient simulations or else, in certain applications, also by a preceding measurement.

A refinement of the invention provides for the use of high-frequency pulses for selective excitation, determined according to Equations (2) and (3) by a numerical simulation of a corresponding magnetic resonance signal.

A refinement of the invention involves the use of high-frequency pulses for the selective excitation with a multiple channel system, determined according to Equations (5) and (6) by a numerical simulation of the corresponding magnetic resonance signals.

A refinement of the invention involves the use of high-frequency pulses for the selective excitation, determined according to Equations (2) and (3) by a first measurement of a corresponding magnetic resonance signal that is then used as the high-frequency pulse in a second measurement.

Another embodiment of the invention involves the use of high-frequency pulses for the selective excitation with a multiple channel system, determined according to Equations (5) and (6) by a first measurement of corresponding magnetic resonance signals that are then used as the high-frequency pulse in a second measurement.

A refinement of the invention provides that the magnetic gradients $G_x$ and $g_y$ are employed at the same time for the k-space encoding, whereby the time curve of the magnetic gradients $g_x$ and $g_y$ runs in a sinus or cosine form, resulting in a spiral coverage of the k-space.

The magnetic gradients ($g_x$, $g_y$, $g_z$) advantageously run orthogonally to each other in space, so that according to a functional relationship $\vec{k}=-\gamma\int \vec{g}(t)dt$ between a resulting magnetic gradient $\vec{g}$ and the resulting vector $\vec{k}$ of the k-space—whereby t represents a time-dependence—the result is an orthogonality of the vectors ($k_x$, 0, 0), (0, $k_y$, 0) and (0, 0, $k_z$). The Greek symbol γ represents a gyromagnetic ratio between the magnetic rotational momentum and the angular momentum of the specimen that is to be examined. For example, the gyromagnetic ratio of protons can be expressed as follows: $\gamma_H = 2\pi \times 42.5749 \times 10^6$ rad s$^{-1}$ T$^{-1}$. Such a determination on a Cartesian coordinate system for describing the k-space is practical but not essential for carrying out the method. Rather, any desired description of the k-space can be selected, whereby if necessary, a transformation into the Cartesian coordinate system is performed.

Advantageously, the time curve of the gradients $g_x$, $g_y$, $g_z$, which results in the spiral coverage of the x-y plane of the k-space, can be described mathematically as follows:

$$G_x(t) = r(t)*\cos(\phi)(t))$$

$$G_y(t) = r(t)*\sin(\phi(t)),$$

$$G_z(t) = 0$$

wherein the values for r(t) and φ(t) are determined by taking the Nyquist criterion into consideration. The gradients should advantageously be applied in such a way that they reach a maximum value within the shortest possible time.

Preferably, the oscillating time curve of the magnetic gradients $g_x$ and $g_y$ during the high-frequency pulse leads to a complete spiral scanning of the coverable two-dimensional k-space.

In an especially preferred embodiment of the invention, for purposes of the further k-space encoding, the magnetic gradient $G_z$ is applied, at least in certain sections, before the magnetic gradients $G_x$ and $G_y$, whereby the magnetic gradient $G_z$ has a constant time curve for the duration of an application, whereas $g_x$ and $g_y$ run inwards or outwards for each $g_z$ application, as a result of which a spiral stack is described in the three-dimensional k-space.

As an alternative, additional embodiments of time curves of the magnetic gradients are used which lead to additional descriptions of the k-space. For example, the k-space can be described by a three-dimensional spiral in which the scanning plane of the spiral windings is constantly rotated during the course of the scanning procedure.

The representative depiction of the volume data record by means of the three-dimensional k-space yields an opening angle of the three-dimensional spiral at least through the amplitude of the magnetic gradient $G_z$.

The invention also has the objective of providing a nuclear spin tomograph that is suitable for carrying out the method according to the invention.

According to the invention, this objective is achieved by a nuclear spin tomograph having a means for generating magnetic gradients, a means for generating high-frequency pulses, and a means for generating a static magnetic field, whereby the nuclear spin tomograph is characterized in that it comprises control electronics for carrying out the magnetic resonance method according to the invention.

A refinement of the nuclear spin tomograph is characterized in that it comprises N coils having a different spatial transmission characteristic for generating N excitation channels.

PRESENTATION OF PREFERRED EMBODIMENTS OF THE INVENTION WITH REFERENCE TO THE FIGURES

Other advantages, special features and practical refinements of the invention ensue from the presentation below of preferred embodiments making reference to the figures.

Figure 2:
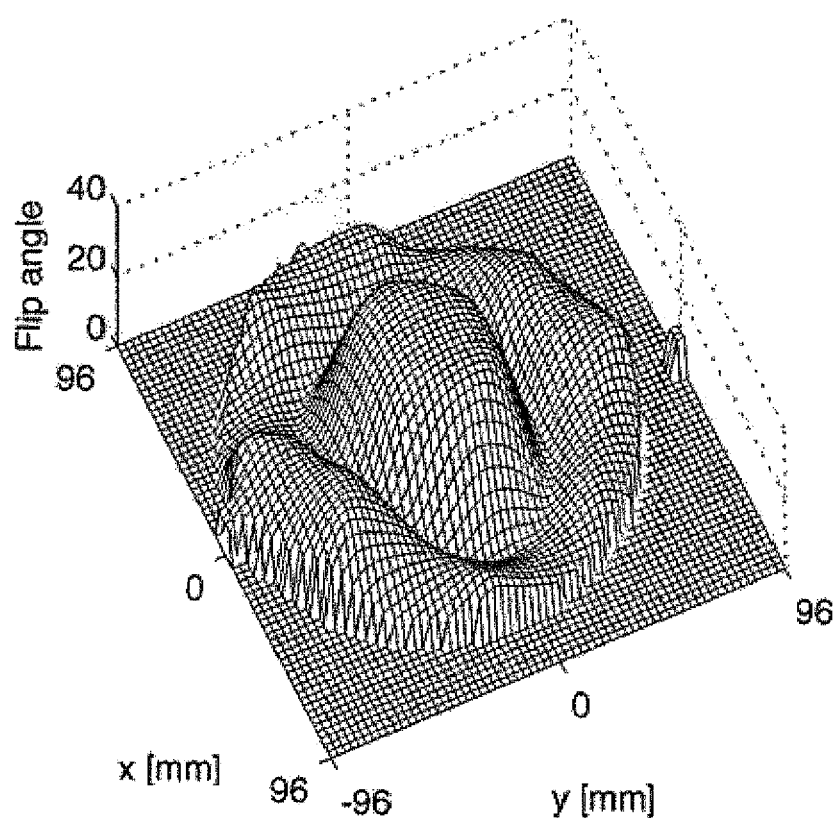
Figure 3:
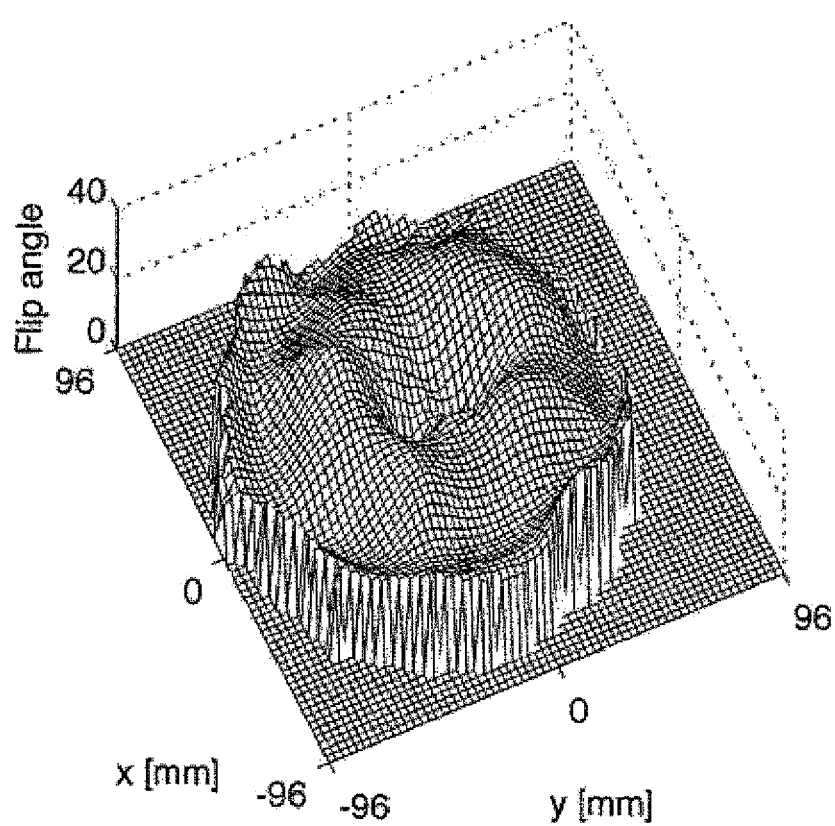
Figure 4:
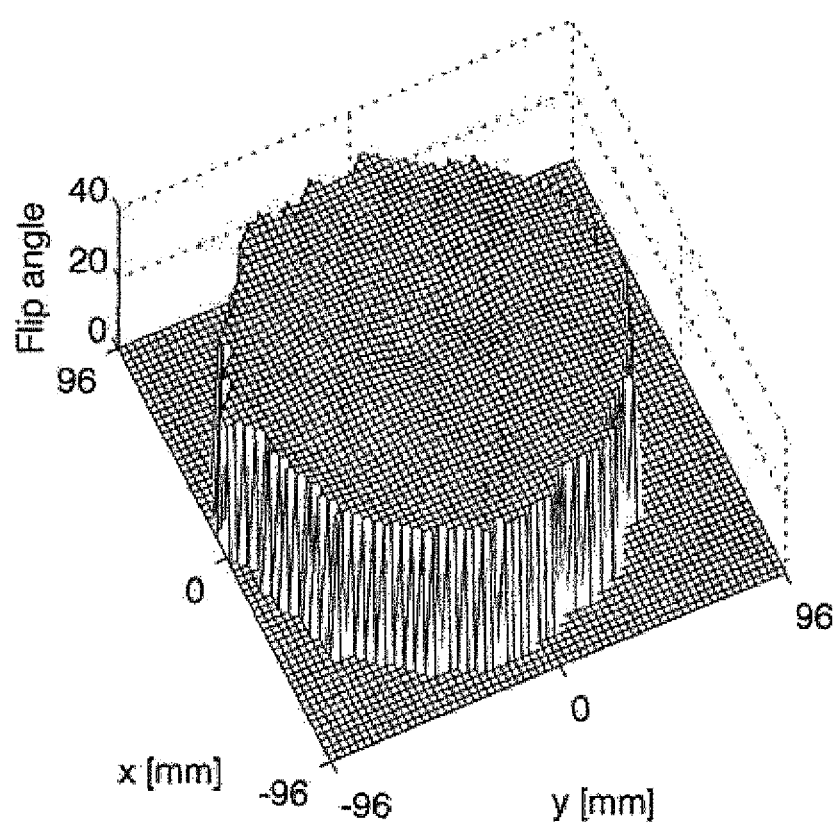
Figure 5:
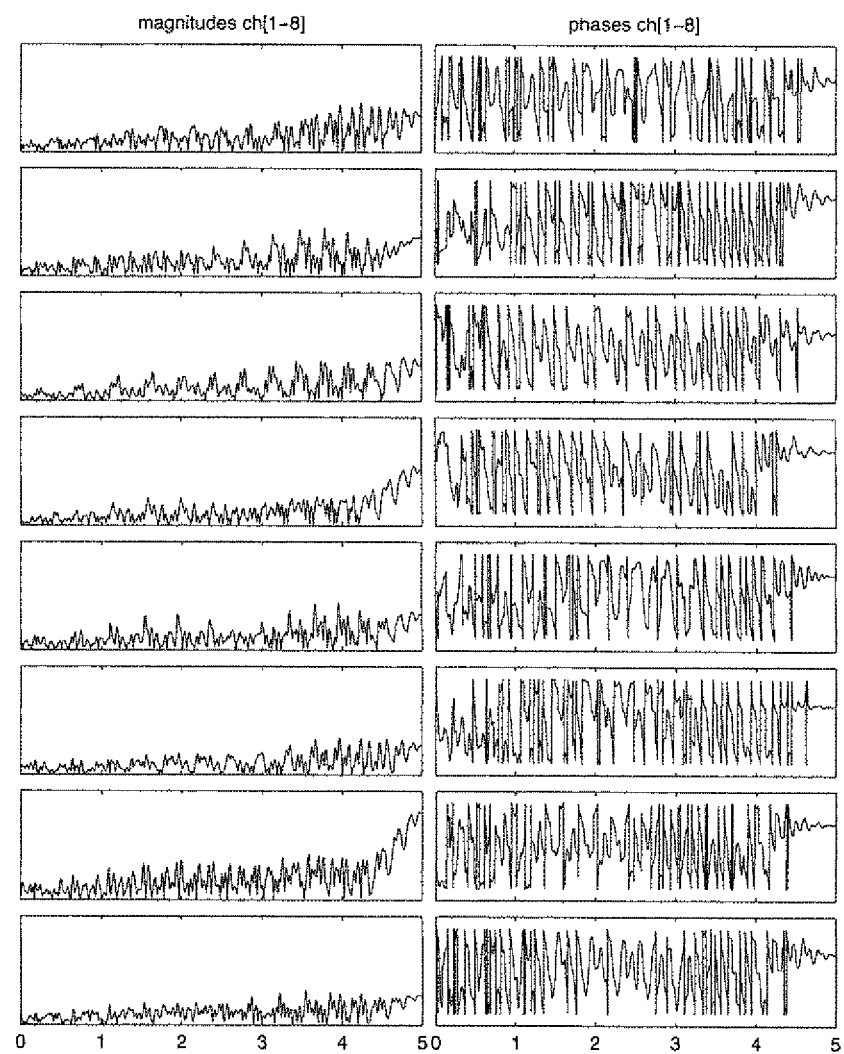

The figures show the following:

FIG. 1 a schematic depiction of the pulse generation procedure;

FIG. 2 a depiction of the spatial sensitivity of the coil and in another partial figure (upper right), the sensitivity to oscillations in another spatial plane (y-plane);

FIG. 3 a quantitative depiction of an excitation image, whereby a spatial distribution is shown in the x- and y-directions and in which the signal intensity is shown in the z-axis;

FIG. 4 an excitation pattern like in FIG. 3, but after the correction for inhomogeneities by means of a method according to the invention, and FIG. 5 amplitudes and phases for generating the excitation profile according to FIG. 4.

The presented new method is used to determine selective high-frequency pulses for applications in magnetic resonance tomography. In this context, the method makes use of fundamental physical and mathematical principles, particularly the reciprocity principle as well as time variance, in order to convert a mathematical inversion problem into an equivalent but much simpler description that is based on the acquisition of a hypothetical magnetic resonance signal. Except for normalizing factors, this signal is the same as the sought high-frequency pulse. Consequently, the following advantages arise as compared to the prior-art methods:

This is a direct (non-iterative) method for finding an unambiguous solution,
the numerical solution is obtained by superposition of analytical solutions and is consequently inherently parallelizable and thus very quickly available,
the process directly takes into account interference effects such as field inhomogeneities and relaxation, so that the solutions behave robustly with respect to these interference effects,
the method can be used directly without considerable numerical effort for the case of multiple excitation channels, that is to say, selective excitation using the spatial sensitivities of several high-frequency excitation coils.

A refinement of the invention comprises an adaptation of an approximation for small excitation angles (Small-Tip-Angle Approximation, STA) described by Pauly (1988, 1989), taking into consideration shifts of the Larmor frequency ($\omega_s$). Accordingly, the selectively excited magnetization is described by:

$$M(\vec{r}, T) = i\gamma M_0 \exp[-T/T_2]\exp[-iT\omega_s] \quad (1)$$
$$\int_0^T \exp[t/T_2]\exp[it\omega_s]b_1(t)\exp\left[i\vec{k}(t)\cdot\vec{r}\right]dt$$

wherein $m(\vec{r},T)$ stands for desired transversal magnetization after the selective excitation, $t, \vec{r}, T$ stands for time, position vector, duration of the pulse, $i, \gamma, M_0$ stands for imaginary unit, gyromagnetic ratio, equilibrium magnetization, $T_2, \omega_s$, stands for transversal relaxation time, shift of the resonance frequency, $b_1(t), \vec{k}(t)$ stands for high-frequency pulse, vector of the k-space trajectory (given by gradients).

Equation (1) is an inverse problem since it has to be resolved on the basis of the sought high-frequency pulse, $b_1(t)$, with a given k-space trajectory of the gradients, k(t) as well as with the given pattern for the excitation, M(r,T), which describes the target region. In contrast to the original presentation by Pauly (1988), Equation (1) differs by the additional consideration of interference effects during the pulse, that is to say, taking into consideration the transversal relaxation ($T_2$) and the shift of the Larmor frequency ($\omega_s$). The latter can occur, for instance, due to the presence of inhomogeneities in the main field.

The newly presented method utilizes the reciprocity of Equation (1) for the well-known signal equation of the magnetic resonance imaging from $$s(t) = \int_V M(\vec{r}, T)\exp[t/T_2]\exp[it\omega_s]\exp\left[-i\vec{k}(T-t)\cdot\vec{r}\right]d^3r \quad (2)$$

which, in the present form, however, describes a time reversal t:T→0, that is to say, a hypothetical magnetic resonance signal s(t), resulting from a volume that is to be examined V, is calculated backwards in time along the k-space trajectory k(T−t) which is traversed backwards. In this process, the initial magnetization is determined by Equation (1) and thus by the target region of the selective excitation. The magnetic resonance signal can be determined either by a numerical simulation of Equation (2) or, in certain cases, also directly by means of a measurement. The sought high-frequency pulse is then found to be:

$$b_1(t) = \frac{J(t)}{i\gamma M_0}s(T-t) \quad (3)$$

that is to say, except for factors, the high-frequency pulse corresponds to the time-inverted magnetic resonance signal. Here, J(t) is the Jacobi determinant to describe the k-space volume element along the trajectory (Hoge et al, 1997). In the case of an analytically given k-space trajectory, J(t) can be calculated explicitly. Thus, for example, in the case of an Archimedean spiral, $$J(t) = \frac{\gamma}{2\pi}|\vec{k}(t)\cdot\vec{g}(t)|,$$

wherein $$\vec{g}(t) = \frac{2\pi}{\gamma}\frac{\partial \vec{k}(t)}{\partial t}$$

describes the pulse shape of the gradient.

If N coils having a different spatial transmission characteristic continue to be used for the excitation, that is to say, if multiple excitation channels are used (Katscher et al. 2003; Zhu, 2004), then the entire high-frequency pulse is $$b_1(t, \vec{r}) = \sum_{n=1}^{N} \sigma_n(\vec{r})b_n(t) \quad (4)$$

wherein $\sigma_n(r)$ stands for the sensitivity of the $n^{th}$ channel, determined, for example, by means of preceding measurements, $b_n(t)$ stands for the sought high-frequency pulse of the N channels.

The use of Equation (4) in Equation (1) yields the formulation of the problem for the selective excitation in case of multiple channels. Corresponding to Equations (2) and (3), a solution of the problem can also be found here by means of a time-inverted hypothetical magnetic resonance signal, whereby now N signals with corresponding complexly conjugated receiving sensitivities, $\sigma_n^*(r)$ have to be determined;

$$s_n(t) = \int_V \sigma_n^*(\vec{r}) M(\vec{r}) \exp[t/T_2] \exp[it\omega_s] \exp[-i\vec{k}(T-t)\cdot\vec{r}] d^3r \quad (5)$$

Equation (5) corresponds formally to the signal pick-up with several receiving channels (Prüssmann et al, 2001), whereby the time reversal according to Equation (2) is once again carried out. If now, equivalent to the single-channel case, these N signals are determined for the magnetization described above along the time-inverted trajectory, k(T−t)—either by a numerical simulation of Equation (5) or by a measurement—then the sought high-frequency pulses are found to be $$b_{1,n}(t) = \frac{J(t)}{i\gamma M_0} s_n(T-t) \quad (6)$$

Therefore, all in all, the determination of the high-frequency pulses, that is to say, the solution of Equation (1) in the case of a single channel—or in the case of multiple channels, taking Equation (3) into consideration—is reduced to the determination of magnetic resonance signals, given by Equations (2) or (4) respectively, which are generally efficiently determined by numerical simulations or else, in certain applications, also directly by a preceding measurement. The sought high-frequency pulse shapes are then also obtained by rescaling according to Equations (3) or (6) respectively. The decisive step of the interpretation of a magnetic resonance signal as a high-frequency pulse, given by Equations (3) and (6), results from the reciprocity principle and can be mathematically derived directly from Equations (1) and (2) for the case of a single channel or from Equations (1), (3) and (5) for the case of multiple channels, insofar as the sensitivities of the coils have favorable properties for the position encoding, as described by Prüssmann et al. (2001) or Katscher et al. (2003). Finally, it should be pointed out that the described method approximately retains its validity, even in the case of a weak spatial variation of the interference effects (transversal relaxation as well as shift of the resonance frequency), even though this dependence was not mentioned explicitly in the equations.

The invention entails numerous advantages. In particular, it is possible to configure high-frequency signals in such a way that a desired (selective) excitation is generated as a systematic magnetization of selected regions of an object that is to be examined.

The invention and its areas of application are suitable for examining numerous objects that are to be examined, whereby these can be living organisms as well as objects. Thanks to the fast execution and the avoidance of interference effects—for example, due to stray fields—the invention is especially well-suited for medical diagnostics.

In particular, high-frequency pulses can be generated in real time, by means of which the contrast differences in selected volume areas of an object that is to be examined can be determined as quickly and reliably as possibly.

The high-frequency pulses can be generated on the basis of one or more preceding examinations of the object that is to be examined and/or on the basis of a numerical calculation.

Advantages of the numerical calculations are the unambiguity of the solution that can be determined. This is due to the fact that an analytical solution can be found.

In case a calculated determination of the configuration of the high-frequency pulses is carried out, it is possible to perform this calculation in a parallelized manner.

Moreover, the invention can also be used with non-linear gradient fields.

$$m(r,t) = i\gamma m_0(r)\epsilon(-t)e^{-ikt\cdot r}\int_0^t b_1(\tau)\epsilon(\tau)e^{ik(\tau)\cdot r}d\tau \quad (7)$$

Ignoring the relaxation, that is to say, $\epsilon(t) \equiv 1$, the result is:

$$m(r,T) = m(r) = i\gamma m_0(r)\int_0^T b_1(\tau)\epsilon(\tau)e^{ik(\tau)\cdot r}d\tau \quad (8)$$

The magnetic resonance signal for the time-inverted trajectory is determined as follows:

$$s(t) = \int_{\mathbb{R}^3} m(r) e^{-ik(t)\cdot r} dr \quad (9)$$

Based on Equations (7), (8) and (9), the following is obtained:

$$\begin{aligned} s(t) &= \int_{\mathbb{R}^3} m(r) e^{-ik(T-t)\cdot r} dr \quad (10)\\ &= i\gamma m_0 \int_{\mathbb{R}^3}\int_0^T b_1(\tau) e^{i[k(\tau)-k(T-t)]\cdot r} d\tau dr \\ &= i\gamma m_0 \int_0^T b_1(\tau)\delta(k(\tau)-k(T-t))d\tau \\ &= i\gamma m_0 \int_0^T \frac{b_1(\tau)}{J(\tau)}\delta(k(\tau)-k(T-t))J(\tau)d\tau \\ &\approx i\gamma m_0 \frac{b_1(T-t)}{J(T-t)} \end{aligned}$$

The high-frequency pulses of the time-inverted k-space trajectory are the result of a corresponding signal, weighted with the Jacobi determinant. The method can likewise be employed with several channels. Here, transmission sensitivities are taken into consideration so that the high-frequency pulses result from the superposition of the individual high-frequency pulses of the individual coils (Katscher et al. 2003, Zhu 2004).

$$b_1(t,r) = \Sigma b_{1,n}(t)\sigma_n(r)$$

is the result for the individual n channels:

$$s_n(t) = i\gamma m_0 \sum_{m=1}^{N} b_{1,m} * \hat{\sigma}_{nm}(T-t) \quad (3)$$

A convolution with an indicator function χ(r) is fundamentally possible in order to take correlations of sensitivities of individual channels into consideration. However, it is also possible to determine suitable configurations of the high-frequency pulses while ignoring these correlations.

The presented method steps are especially well-suited to obtain a desired pulse shape for the high-frequency pulses.

A schematic depiction of the acquisition of the high-frequency pulses is shown in FIG. 1.

FIG. 1 sketches the pulse generation procedure. The control and processing module measures the sensitivities of the coils employed. These are complexly conjugated and used for the simulation of the hypothetical imaging of the chessboard pattern given by way of an example, whereby the signals for the individual coils are obtained. After the processing has been carried out by taking into consideration the coordinate transformation of k to t by the weighting with the Jacobi determinant, these pulses are used for the excitation.

The magnetic resonance methods according to the invention can be used in any nuclear spin tomographs and in a wide range of magnetic field strengths. However, it is especially advantageous to use the present invention for high magnetic field strengths, especially for magnetic field strengths above 6 T. The reason for this is that stronger interference fields can occur at greater magnetic field strengths.

In particular, it is possible for stray fields to form at high magnetic field strengths and/or at high excitation frequencies, preferably of several hundred MHz. According to the invention, these stray fields are prevented by the measures presented here.

In the example below, a high excitation frequency of 400 MHz is employed.

The experimental results below were obtained for 1,000,000 isochromates for a three-dimensional spiral trajectory with a duration of 5.12 ms within a cluster using a computing unit, consisting, for example, of 16 AMD Opteron 2378 8-core CPUs each operated, for example, at 2.4 GHz within 1:20 min.

First of all, a specimen that is to be examined is exposed to the static main magnetic field, a process in which the macroscopic magnetization is formed and is oriented parallel to the course of the main magnetic field, corresponding to the orientation of the equilibrium state. In this equilibrium state, a transversal component of the macroscopic magnetization is small or equal to zero.

The applied high-frequency pulse saturates the macroscopic magnetization. The data acquisition time theoretically depends at least on the performance of the gradient system employed, on any physiological factors of the specimen that is to be examined (electrophysiological stimulus threshold of the muscles, etc.).

The specimen that is to be examined can comprise numerous living organisms including humans or else inanimate objects. In particular, the invention is suited for a determination, a precise localization, or a specification of differences of at least one material parameter that is to be examined.

The volume that is to be examined comprises especially one or more partial regions of the object that is to be examined, whereby a total scanning of the object is likewise encompassed.

The preceding presentation relates to preferred embodiments of the invention. It is, of course, possible to employ the individually presented measures separately from each other.

SYMBOLS $\gamma$ gyromagnetic ratio
$m_0$ equilibrium magnetization
r position coordinates
k(t) k-space trajectory
m(T,r) desired transversal magnetization
$b_{1,n}(t)$ high-frequency field
$\chi(e)$ indicator function for the volume that is to be examined
^3D Fourier Transformation of the k-space
$\sigma_n(r)$ sensitivity of the $n^{th}$ coil, corresponding to the sensitivity of the $n^{th}$ channel
$\sigma_{nm}(k)$ correlation matrix

The invention claimed is:

1. A magnetic resonance method involving the generation of high-frequency pulses and magnetic gradients ($g_x$, $g_y$, $g_z$) for the selective excitation of an object that is to be examined, whereby the magnetic resonance method comprises the following steps:

providing a transversal magnetization m($\vec{r}$, T) which is described by $$m(\vec{r}, T) = i\gamma m_0 \exp[-T/T_2]\exp[-iT\omega_s]\int_0^T \exp[t/T_2]\exp[it\omega_s]b_1(t)\exp[i\vec{k}(t)\cdot\vec{r}]dt$$

wherein i stands for an imaginary unit, $\gamma$ stands for a gyromagnetic ratio, $m_0$ stands for an equilibrium magnetization, t stands for a time, $\vec{r}$; stands for a position vector and T stands for a duration of a pulse, $T_2$ stands for a transversal relaxation time, $\omega_s$ stands for a shift of the resonance frequency, $b_1(t)$ stands for a high-frequency pulse, and $\vec{k}(t)$ stands for a vector of the k-space trajectory that is given by the magnetic gradients, determining the high-frequency pulse by means of a signal equation s(t) according to:

$$s(t) = \int_V m(\vec{r}, T)\exp[t/T_2]\exp[it\omega_s]\exp\left[-i\vec{k}(T-t)\cdot\vec{r}\right]d^3r$$

wherein V stands for a volume that is to be examined, so that, except for factors, the high-frequency pulse is obtained as:

$$b_1(t) = \frac{J(t)}{i\gamma m_0}s(T-t)$$

wherein J(t) is a Jacobi determinant that, under the premise of the bijectivity of k(t) onto a value range of t, yields the dependence of the coordinate transformation between the time parameterization and the k-space parameterization, using the high-frequency pulse to excite the volume that is to be examined, detecting the measured signal generated by the high-frequency pulse in the volume that is to be examined, and evaluating the measured signal.

2. The magnetic resonance method according to claim 1, characterized in that N coils having a different spatial transmission characteristic are used for the excitation.

3. The magnetic resonance method according to claim 2, characterized in that the high-frequency pulse $b_1(t, \vec{r})$ is generated taking the following formula into account:

$$b_1(t, \vec{r}) = \sum_{n=1}^{N} \sigma_n(\vec{r})b_n(t)$$

wherein $\sigma_n(r)$ stands for a sensitivity of the $n^{th}$ channel, $b_{1,n}(t)$ is determined by the formula $$b_{1,n}(t) = \frac{J(t)}{i\gamma M_0} s_n(T-t)$$

and designates the sought high-frequency pulses of the individual N transmission channels, $b_1(t,r)$ stands for the superposition of the individual sensitivity-weighted pulses, and $b_{1,n}(t)$ stands for r at all locations.

4. The magnetic resonance method according to claim 3, characterized in that the sensitivity $\sigma_n(r)$ is determined on the basis of a numerical calculation.

5. The magnetic resonance method according to claim 3, characterized in that complexly conjugated receiving sensitivities, $\sigma_n^*(r)$, are determined:

$$s_n(t) = \int_V \sigma_n^*(\vec{r}) M(\vec{r}) \exp[t/T_2] \exp[it\omega_s] \exp\left[-i\vec{k}(T-t)\cdot\vec{r}\right] d^3r$$

wherein the N high-frequency pulses $b_{1,n}$ according to claim 1 can be calculated on the basis of $$b_{1,n}(t) = \frac{J(t)}{i\gamma M_0} s_n(T-t).$$

6. The magnetic resonance method according to claim 5, characterized in that the sensitivity $\sigma_n(r)$ is determined by means of one or more measurements of a magnetic resonance signal of the object that is to be examined, so that the high-frequency pulse is determined on the basis of the one or more preceding measurements.

7. A nuclear spin tomograph having a means for generating magnetic gradients, a means for generating high-frequency pulses, and a means for generating a static main magnetic field, and having a means for data acquisition, characterized in that it comprises control electronics for carrying out the magnetic resonance method according to one of claim 1.

8. The nuclear spin tomograph according to claim 7, characterized in that it comprises N coils having a different spatial transmission characteristic for generating N excitation channels, whereby the number N is greater than 1 and fundamentally not limited upwards.

* * * * *